(12) United States Patent
Kweskin et al.

(10) Patent No.: US 11,848,227 B2
(45) Date of Patent: *Dec. 19, 2023

(54) METHOD OF MANUFACTURING A SEMICONDUCTOR ON INSULATOR STRUCTURE BY A PRESSURIZED BOND TREATMENT

(71) Applicant: GlobalWafers Co., Ltd., Hsinchu (TW)

(72) Inventors: Sasha Joseph Kweskin, St. Louis, MO (US); Henry Frank Erk, St. Louis, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 506 days.

This patent is subject to a terminal disclaimer.

(21) Appl. No.: 16/079,592

(22) PCT Filed: Mar. 3, 2017

(86) PCT No.: PCT/US2017/020614
§ 371 (c)(1),
(2) Date: Aug. 24, 2018

(87) PCT Pub. No.: WO2017/155804
PCT Pub. Date: Sep. 14, 2017

(65) Prior Publication Data
US 2019/0164811 A1    May 30, 2019

Related U.S. Application Data

(60) Provisional application No. 62/304,389, filed on Mar. 7, 2016.

(51) Int. Cl.
*H01L 21/762* (2006.01)
*H01L 21/324* (2006.01)

(52) U.S. Cl.
CPC ...... *H01L 21/76254* (2013.01); *H01L 21/324* (2013.01)

(58) Field of Classification Search
CPC .... H01L 21/76251–76259; H01L 21/185–187
See application file for complete search history.

(56) References Cited

U.S. PATENT DOCUMENTS

| | | | |
|---|---|---|---|
| 4,501,060 A | 2/1985 | Frye et al. |
| 4,755,865 A | 7/1988 | Wilson et al. |
| 4,968,384 A | 11/1990 | Asano |
| 5,189,500 A | 2/1993 | Kusunoki |
| 6,043,138 A | 3/2000 | Ibok |

(Continued)

FOREIGN PATENT DOCUMENTS

| | | |
|---|---|---|
| EP | 0939430 A2 | 1/1999 |
| EP | 1865551 A2 | 12/2007 |

(Continued)

OTHER PUBLICATIONS

U.S. Appl. No. 16/079,373, filed Feb. 2019, Kweskin.*

(Continued)

*Primary Examiner* — Shahed Ahmed
*Assistant Examiner* — Sun Mi Kim King
(74) *Attorney, Agent, or Firm* — Armstrong Teasdale LLP

(57) ABSTRACT

A method is provided for preparing a semiconductor-on-insulator structure comprising a step of high pressure bonding.

27 Claims, 5 Drawing Sheets

(56) References Cited

U.S. PATENT DOCUMENTS

| | | |
|---|---|---|
| 6,373,113 B1 | 4/2002 | Gardner et al. |
| 6,562,127 B1 | 5/2003 | Kud et al. |
| 6,624,047 B1 | 9/2003 | Sakaguchi et al. |
| 7,868,419 B1 | 1/2011 | Kerr et al. |
| 7,879,699 B2 | 2/2011 | Schulze et al. |
| 7,915,716 B2 | 3/2011 | Pisigan et al. |
| 8,058,137 B1 | 11/2011 | Or-Bach et al. |
| 8,076,750 B1 | 12/2011 | Kerr et al. |
| 8,466,036 B2 | 6/2013 | Brindle et al. |
| 8,481,405 B2 | 7/2013 | Arriagada et al. |
| 8,796,116 B2 | 8/2014 | Grabbe et al. |
| 8,846,493 B2 | 9/2014 | Libbert et al. |
| 8,859,393 B2 | 10/2014 | Ries et al. |
| 9,202,711 B2 | 12/2015 | Liu et al. |
| 10,573,550 B2 * | 2/2020 | Kweskin ............ H01L 21/0217 |
| 2002/0090758 A1 | 7/2002 | Henley et al. |
| 2004/0005740 A1 | 1/2004 | Lochtefeld et al. |
| 2004/0031979 A1 | 2/2004 | Lochtefeld et al. |
| 2004/0108537 A1 | 6/2004 | Tiwari |
| 2005/0026432 A1 * | 2/2005 | Atwater, Jr. ........ H01L 31/0392 |
| | | 438/689 |
| 2005/0153524 A1 | 7/2005 | Maa et al. |
| 2005/0167002 A1 | 8/2005 | Ghyselen et al. |
| 2006/0030124 A1 | 2/2006 | Maa et al. |
| 2006/0033110 A1 | 2/2006 | Alam et al. |
| 2006/0226482 A1 | 10/2006 | Suvorov |
| 2006/0240640 A1 * | 10/2006 | Nesterenko .......... B23K 20/021 |
| | | 438/455 |
| 2007/0032040 A1 | 2/2007 | Lederer |
| 2007/0054466 A1 | 3/2007 | Hebras |
| 2008/0171443 A1 | 7/2008 | Hebras |
| 2009/0004833 A1 | 1/2009 | Suzuki et al. |
| 2009/0014828 A1 | 1/2009 | Mizushima et al. |
| 2009/0092810 A1 | 4/2009 | Lee et al. |
| 2009/0117716 A1 * | 5/2009 | Shimomura ...... H01L 21/76254 |
| | | 438/487 |
| 2009/0278233 A1 | 11/2009 | Pinnington et al. |
| 2009/0321829 A1 | 12/2009 | Nguyen et al. |
| 2011/0049594 A1 * | 3/2011 | Dyer ................ H01L 21/76254 |
| | | 438/149 |
| 2011/0174362 A1 | 7/2011 | Tanner et al. |
| 2011/0298083 A1 | 12/2011 | Yoneda |
| 2012/0091587 A1 | 4/2012 | Or-Bach et al. |
| 2012/0161310 A1 | 6/2012 | Brindle et al. |
| 2012/0238070 A1 | 9/2012 | Libbert et al. |
| 2012/0267681 A1 | 10/2012 | Nemoto et al. |
| 2013/0120951 A1 | 5/2013 | Zuo et al. |
| 2013/0122672 A1 | 5/2013 | Or-Bach et al. |
| 2013/0168835 A1 | 7/2013 | Botula et al. |
| 2013/0193445 A1 | 8/2013 | Dennard et al. |
| 2013/0294038 A1 | 11/2013 | Landru et al. |
| 2013/0344680 A1 | 12/2013 | Arriagada et al. |
| 2014/0042598 A1 | 2/2014 | Kitada et al. |
| 2014/0070215 A1 | 3/2014 | Bedell et al. |
| 2014/0084290 A1 | 3/2014 | Allibert et al. |
| 2014/0120654 A1 | 5/2014 | Fujii |
| 2014/0124902 A1 | 5/2014 | Botula et al. |
| 2014/0273405 A1 | 9/2014 | Liu et al. |
| 2015/0004778 A1 | 1/2015 | Botula et al. |
| 2015/0115480 A1 | 4/2015 | Peidous et al. |
| 2015/0112308 A1 | 7/2015 | Peidous |
| 2015/0243629 A1 * | 8/2015 | Herbots ................ H01L 31/048 |
| | | 438/455 |

FOREIGN PATENT DOCUMENTS

| | | | |
|---|---|---|---|
| EP | 2426701 A1 | | 7/2012 |
| EP | 2579303 A1 | | 10/2013 |
| JP | 2012253364 A | | 12/2012 |
| KR | 2000-0066010 | * | 11/2000 |
| WO | 2009120407 A2 | | 10/2009 |
| WO | 2012127006 A1 | | 9/2012 |
| WO | 2015112308 A1 | | 7/2015 |
| WO | 2015119742 A1 | | 8/2015 |

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546, vol. 72, No. 20.

Lu, Hongqiang et al., Characterization of methyl-doped silicon oxide film deposited using Flowfil(TM) chemical vapor deposition technology, Journal of Vacuum Science and Technology, Part B, May 2002, pp. 828-833, vol. 20, No. 3, Melville, New York.

Tong, Q. Y. et al., Semiconductor wafer bonding: recent developments, Materials Chemistry and Physics, Mar. 1994, pp. 101/127, vol. 37, No. 2, Elsevier Sequoia.

International Search Report and Written Opinion of the International Searching Authority regarding PCT/US2017/020614 dated May 18, 2017; pp. 1-11.

* cited by examiner

METHOD OF MANUFACTURING A SEMICONDUCTOR ON INSULATOR STRUCTURE BY A PRESSURIZED BOND TREATMENT

CROSS REFERENCE TO RELATED APPLICATION(S)

This application is a National Stage application of International Application No. PCT/US2017/020614, filed on Mar. 3, 2017, the entire disclosure of which is hereby incorporated by reference as if set forth in its entirety. International Application No. PCT/US2017/020614 claims the benefit of priority to U.S. Provisional Patent Application No. 62/304,389, which was filed 7 Mar. 2016, the disclosure of which is hereby incorporated by reference as if set forth in its entirety.

FIELD OF THE INVENTION

The present invention generally relates to the field of semiconductor wafer manufacture. More specifically, the present invention relates to a method of a semiconductor-on-insulator (e.g., silicon-on-insulator) structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

Complications associated with multilayer SOI structures include variations in flatness and sensitivity to defects at the bond interface. Common solutions to this include CMP, which is costly and may leave scratches or thickness variation. The traditional SOI structure specifications include electrical characteristic that can be easily integrated into devices.

SUMMARY OF THE INVENTION

The present invention is directed to a method for preparing a multilayer semiconductor on insulator structure that resists impurities contained in a handle substrate from having an influence on the device.

The present invention is further directed to a method of preparing a multilayer structure, the method comprising: bonding a donor dielectric layer on a front surface of a single crystal semiconductor donor substrate to a front surface of a single crystal semiconductor handle substrate to thereby form a bonded structure, wherein (i) the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate and (ii) the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, a central plane between the front and back surfaces of the semiconductor donor substrate, and a bulk region between the front and back surfaces of the semiconductor donor substrate, and further wherein the single crystal semiconductor donor substrate comprises a cleave plane; and annealing the bonded structure at a temperature and for a duration sufficient to strengthen the bond between the donor dielectric layer of the single crystal semiconductor donor substrate and the front surface of the single crystal semiconductor handle substrate, wherein annealing occurs at a temperature between about 300° C. and about 700° C., and at a pressure between about 0.5 MPa and about 200 MPa.

The present invention is still further directed to a method of preparing a multilayer structure, the method comprising: bonding a donor dielectric layer on a front surface of a single crystal semiconductor donor substrate to a handle dielectric layer on a front surface of a single crystal semiconductor handle substrate to thereby form a bonded structure, wherein (i) the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate and (ii) the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, a central plane between the front and back surfaces of the semiconductor donor substrate, and a bulk region between the front and back surfaces of the semiconductor donor substrate, and further wherein the single crystal semiconductor donor substrate comprises a cleave plane; and annealing the bonded structure at a temperature and for a duration sufficient to strengthen the bond between the donor dielectric layer of the single crystal semiconductor donor substrate and the front surface of the single crystal semiconductor handle substrate, wherein annealing occurs at a temperature between about 300° C. and about 700° C., and at a pressure between about 0.5 MPa and about 200 MPa.

Other objects and features will be in part apparent and in part pointed out hereinafter.

DETAILED DESCRIPTION OF THE EMBODIMENT(S) OF THE INVENTION

Figure 1A:
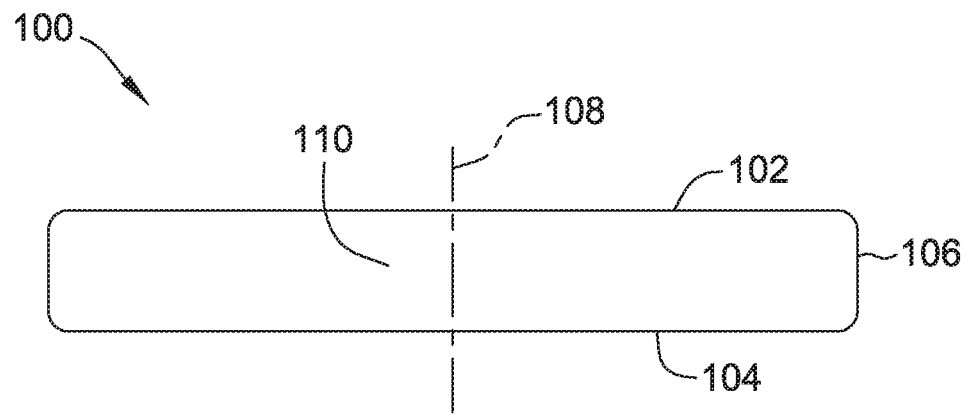
FIGS. 1A through 1C depict a process flow according to some embodiments of the present invention.

The present invention is directed to a multi-layered semiconductor-on-insulator structure (SOI, e.g., a silicon-on-insulator structure) that resists impurities contained in a handle substrate from having an influence on the device. The dielectric layer in the semiconductor-on-insulator structure may comprise one or more insulating layers located between the handle substrate and the donor substrate or device layer. The one or more insulating layers in the SOI structure according to the present invention may include silicon nitride, silicon oxide, silicon oxynitride, and combinations of these materials. Preferably, the dielectric layer comprises a multilayer comprising at least two insulating layers comprising these materials, or at least three insulating layers, or more insulating layers. According to some embodiments of the present invention, the insulating layer may comprises an oxide-nitride-oxide dielectric (ONO) in which an oxide layer in interfacial contact with the handle substrate an a second oxide layer is in interfacial contact with the donor substrate or device layer. The nitride layer is between the two oxide layers.

In a multi-layered semiconductor-on-insulator structure (SOI, e.g., a silicon on insulator structure) comprising an oxide-nitride-oxide dielectric layer (ONO), the buried oxide under the nitride may not be present in the final device. Therefore, process steps that are newly available in the deposition, treatment, and integration can reduce the cost and facilitate customer manufacturing.

According to some embodiments of the present disclosure, a method is provided to create an oxide layer in an SOI structure, preferably, an oxide layer in an ONO multilayer structure. By depositing a flowable oxide or oxide capable or low temperature reflow, the implanted donor roughness or flatness will be mitigated after bonding. The purpose of this method is to improve reliability and reduce cost of multilayer SOI structures. If the oxide underlayer flows, bond voids and interface defect sensitivity can be reduced.

According to some embodiments of the present disclosure, a method is provided to optimize layer transfer (e.g., by lessened dependence on surface energy and flatness/roughness, reduced voids, increased bond strength, prevention of autocleave, and reduced terrace width) by making use of pressurized bond treatment and/or pressurized post cleave anneal. The purpose of this method is to improve reliability of transfer, improve bond properties, and prevent thermal cleave.

I. Semiconductor Handle Substrate and Semiconductor Donor Substrate

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane. According to the method of the present invention, one or more insulating layers may be prepared on the surfaces of either or both the single crystal semiconductor handle wafer and the single crystal semiconductor donor wafer.

FIGS. 1A through 1C, FIG. 2, and FIG. 3 depict a process flow according to some embodiments of the present invention. With reference to FIG. 1A, an exemplary, non-limiting single crystal semiconductor handle substrate or wafer 100 is depicted. In general, the single crystal semiconductor handle wafer 100 comprises two major, generally parallel surfaces. One of the parallel surfaces is a front surface 102 of the single crystal semiconductor handle wafer 100, and the other parallel surface is a back surface 104 of the single crystal semiconductor handle wafer 100. The single crystal semiconductor handle wafer 100 comprises a circumferential edge 106 joining the front and back surfaces 102, 104. The single crystal semiconductor handle wafer 100 comprise a central axis 108 perpendicular to the two major, generally parallel surfaces 102, 104 and also perpendicular to a central plane defined by the points midway between the front and back surfaces 102, 104. The single crystal semiconductor handle wafer 100 comprises a bulk region 110 between the two major, generally parallel surfaces 102, 104. Since semiconductor wafers, e.g., silicon wafers, typically have some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within an imaginary central plane which is approximately equidistant between the front and back surfaces 102, 104.

Prior to any operation as described herein, the front surface 102 and the back surface 104 of the single crystal semiconductor handle wafer 100 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle wafer 100, e.g., a single crystal silicon handle wafer, refers to the major surface of the substrate that becomes an interior surface of the bonded structure. Accordingly, a "back surface" of a single crystal semiconductor handle wafer 100, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. In the context of the present invention, one or more insulating layers may be prepared on the front surfaces of either or both the single crystal semiconductor handle substrate 100 and the single crystal semiconductor donor substrate. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., Handbook of Semiconductor Silicon Technology, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the single crystal semiconductor wafers, i.e., single crystal semiconductor handle wafer and single crystal semiconductor donor wafer, comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA. Interstitial oxygen may be measured according to SEMI MF 1188-1105.

The single crystal semiconductor handle wafer 100 may have any resistivity obtainable by the Czochralski or float zone methods. Accordingly, the resistivity of the single crystal semiconductor handle wafer 100 is based on the requirements of the end use/application of the structure of the present invention. The resistivity may therefore vary from milliohm or less to megaohm or more. In some embodiments, the single crystal semiconductor handle wafer 100 comprises a p-type or an n-type dopant. Suitable dopants include boron (p type), gallium (p type), phosphorus (n type), antimony (n type), and arsenic (n type). The dopant concentration is selected based on the desired resistivity of the handle wafer. In some embodiments, the single crystal semiconductor handle substrate comprises a p-type dopant. In some embodiments, the single crystal semiconductor handle substrate is a single crystal silicon wafer comprising a p-type dopant, such as boron.

In some embodiments, the single crystal semiconductor handle wafer 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle substrate 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), aluminum (p type), indium (p type), phosphorus (n type), antimony (n type), and arsenic (n type).

In some embodiments, the single crystal semiconductor handle wafer 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle substrate has a bulk resistivity between about 1000 Ohm-cm and about 6,000 Ohm-cm. Methods for preparing high resistivity wafers are known in the art, and such high resistivity wafers may be obtained from commercial suppliers, such as SunEdison Semiconductor Ltd. (St. Peters, MO; formerly MEMC Electronic Materials, Inc.).

The single crystal semiconductor handle wafer 100 may comprise single crystal silicon. The single crystal semiconductor handle wafer 100 may have, for example, any of (100), (110), or (111) crystal orientation, and the choice of crystal orientation may be dictated by the end use of the structure.

Optionally, the front surface 102, the back surface 104, or both may be oxidized according to methods known in the art. Oxidation may be accomplished by means known in the art, such as thermal oxidation (in which some portion of the deposited semiconductor material film will be consumed) or CVD oxide deposition. The oxidation layer on the front surface 102, the back surface 104, or both may be at least about 1 nanometer thick, such as between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution. In some embodiments, the SC1 solution comprises 5 parts deionized water, 1 part aqueous (ammonium hydroxide, 29% by weight of $NH_3$), and part of aqueous $H_2O_2$ (hydrogen peroxide, 30%). In some embodiments, the handle substrate may be oxidized by exposure to an aqueous solution comprising an oxidizing agent, such as an SC2 solution. In some embodiments, the SC2 solution comprises 5 parts deionized water, 1 part aqueous HCl (hydrochloric acid, 39% by weight), and 1 part of aqueous $H_2O_2$ (hydrogen peroxide, 30%).

II. Dielectric Layer Comprising One or More Insulating Layers

Figure 2:
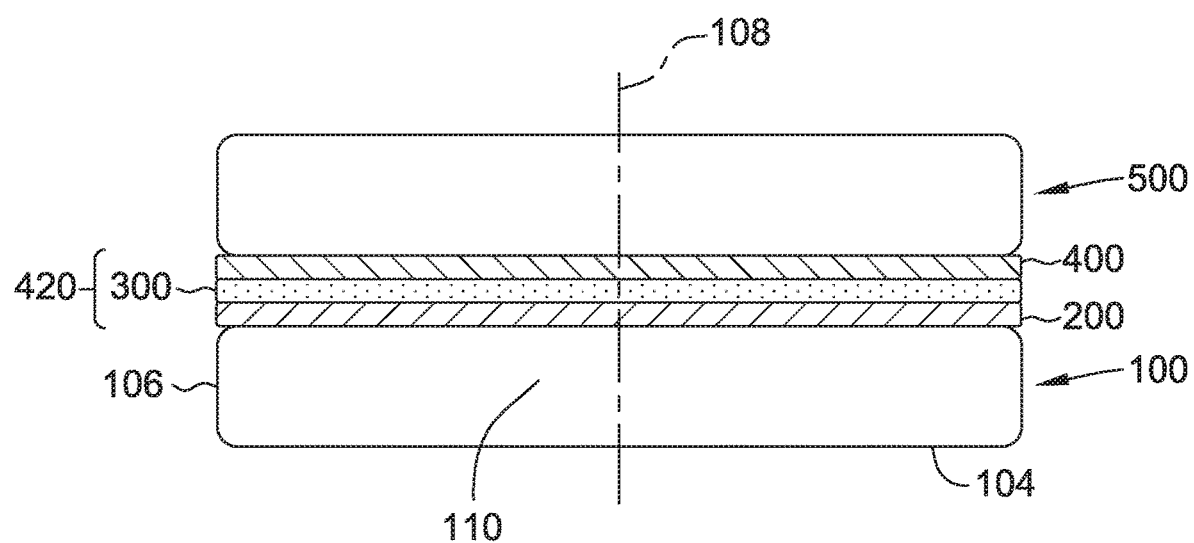
FIG. 2 depicts a multilayer structure according to some embodiments of the present invention.
Figure 3:
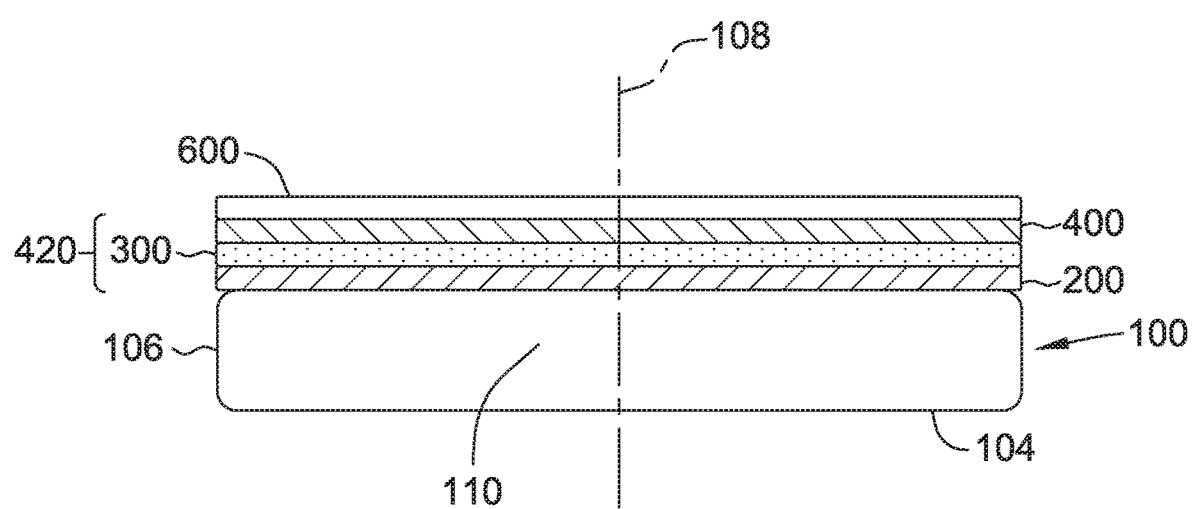
FIG. 3 depicts a multilayer structure according to some embodiments of the present invention.

According to the method of the present invention, and with reference to FIG. 2, a dielectric layer 420 comprising one or more insulating layers (e.g., three or more insulating layers, therein numbers 200, 300, and 400) is prepared between a single crystal semiconductor handle substrate 100 and a single crystal semiconductor donor substrate 500. With reference to FIG. 2, a non-limiting, exemplary multi-layered semiconductor-on-insulator structure (SOI, e.g., a silicon on insulator structure) is depicted. According to FIG. 2, the SOI structure comprises a dielectric layer 420 comprising three insulating layers, e.g., an oxide-nitride-oxide dielectric layer (ONO), according to some embodiments of the present invention. In some embodiments, the multi-layered semiconductor-on-insulator structure comprises a single crystal semiconductor handle substrate 100, a first semiconductor oxide layer 200, a semiconductor nitride layer 300, a second semiconductor oxide layer 400, and a single crystal semiconductor donor substrate 500. Other configurations of insulating layers fall within the scope of the present disclosure. For example, one or more insulating layers may be excluded from the dielectric layer, or additional insulating layers may be included. With reference to FIG. 2, the bonding interface can be any of the following: (1) between the first semiconductor oxide layer 200 and the semiconductor nitride layer 300, (2) between the semiconductor nitride layer 300 and the semiconductor second oxide layer 400, and (3) between the first semiconductor oxide layer 200 and the second semiconductor oxide layer 400 if the structure lacks a nitride layer.

The dielectric layer 420 may comprise the ONO layers as depicted in FIG. 2, or may comprise other structures comprising one or more layers of insulating material. The dielectric layer 420 may be formed upon the front surface of the single crystal semiconductor handle substrate 100 or it may be formed upon the front surface of the single crystal semiconductor donor substrate 500. In still further embodiments, portions of the dielectric layer 420 may be contributed by insulating layers formed upon both the front surface of the single crystal semiconductor handle substrate 100 and the front surface of the single crystal semiconductor donor substrate 500.

The dielectric layer according to the present invention may comprise insulating materials selected from among silicon dioxide, silicon nitride, silicon oxynitride, hafnium oxide, titanium oxide, zirconium oxide, lanthanum oxide, barium oxide, and any combination thereof. In some embodiments, the dielectric layer comprises one or more insulating material selected from the group consisting of silicon dioxide, silicon nitride, silicon oxynitride, and any combination thereof. In some embodiments, the dielectric layer has a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the dielectric layer 420 comprises multiple layers of insulating material, for example, as depicted in FIG. 2, although other configurations are within the scope of this invention.

The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. Each insulating layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the dielectric layer comprises two insulating layers, wherein the two insulating layers comprise silicon dioxide layer, silicon nitride, silicon oxynitride, or any combination thereof. In some embodiments, the dielectric layer comprises two insulating layers prepared upon the front surface of a single crystal semiconductor donor substrate. For example, the two layers comprise a silicon dioxide layer in interfacial contact with the front surface of the single crystal semiconductor donor substrate (before the cleaving process) or the single crystal semiconductor device layer (after the cleaving process) and a silicon nitride layer in interfacial contact with the silicon dioxide layer. In some embodiments, the dielectric layer comprises two insulating layers prepared upon the front surface of a single crystal semiconductor handle substrate. In some embodiments, the dielectric layer comprises two insulating layers, one of which is prepared upon the front surface of a single crystal semiconductor handle substrate, and the other of which is prepared upon the front surface of a single crystal semiconductor donor substrate. Each insulating layer within a bilayer dielectric layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, and as depicted in FIG. 2, the dielectric layer 420 comprises three insulating layers. In some embodiments, the three insulating layers comprise a silicon dioxide layer, a silicon nitride layer in interfacial contact with the silicon dioxide layer, and a silicon dioxide layer in interfacial contact with the silicon nitride layer. In some embodiments, the dielectric layer comprises three insulating layers prepared upon the front surface of a single crystal semiconductor donor substrate. For example, the dielectric layer 420 comprises three insulating layers, wherein the three insulating layers comprise a silicon dioxide layer in interfacial contact with the front surface of the single crystal semiconductor donor substrate (before the cleaving process) or the single crystal semiconductor device layer (after the cleaving process), a silicon nitride layer in interfacial contact with the silicon dioxide layer, and a silicon dioxide layer in interfacial contact with the silicon nitride layer. In some embodiments, the dielectric layer comprises three insulating layers prepared upon the front surface of a single crystal semiconductor handle substrate. In some embodiments, the dielectric layer comprises three insulating layers, one or two of which are prepared upon the front surface of a single crystal semiconductor handle substrate, and the other one or two of which are prepared upon the front surface of a single crystal semiconductor donor substrate. Each insulating layer within a trilayer dielectric layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

III. Flowable Insulating Layer and Reflowable Insulating Layer

Figure 1B:
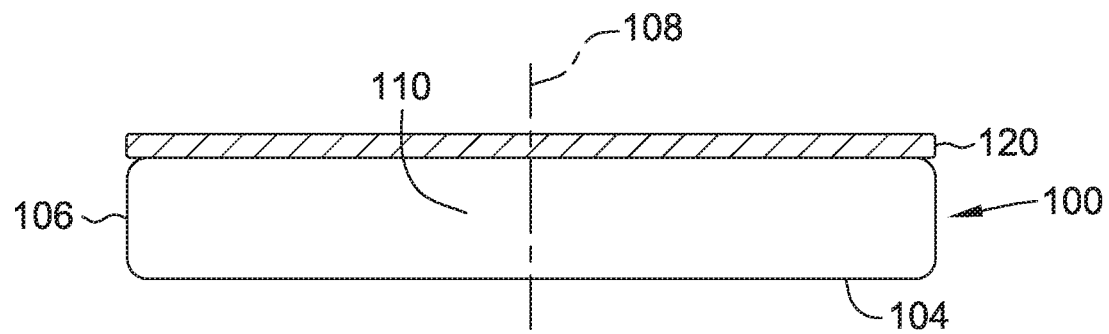

In some embodiments, and with reference to FIGS. 1A and 1B, at least a portion, i.e., one, two, three or more insulating layers, of the dielectric layer is formed upon the front surface 102 of the single crystal semiconductor handle substrate 100. In some embodiments, an insulating layer 120 comprising a flowable or reflowable material is deposited upon the front surface 102 of the single crystal semiconductor handle substrate 100. In some embodiments, and with reference to FIG. 1C, an additional insulating layer 140, which may be an oxide layer, an oxynitride layer, or a nitride layer, may be deposited upon the insulating layer 120 comprising a flowable or reflowable material. In other embodiments, the handle substrate 100 comprising the insulating layer 120 comprising a flowable or reflowable material is not subjected to further deposition, and the insulating layer 120 comprising a flowable or reflowable material is useful as the bonding interface, thereby taking advantage of the flowable or reflowable insulating layer's planarizing properties, which reduces roughness/voids in the bonding region. In still further embodiments, the flowable or reflowable material may be deposited on the front surface of the single crystal semiconductor donor substrate.

In some embodiments, an insulating layer comprising a reflowable material is deposited upon the front surface 102 of the single crystal semiconductor handle substrate 100. A reflowable insulating layer comprises a material capable of flowing at a temperature of less than about 1000° C. A curing step may be employed in order to smooth and planarize an insulating layer comprising a reflowable material. Reflowable behavior of films occurs due to heating the layer after deposition for void free planarization. Doped films are a common way to lower the glass transition temperature. By allowing the film to "reflow" at high temperatures, voids may disappear, and bond strength due to the added contact is expected.

In some embodiments, an insulating layer comprising a flowable material is deposited upon the front surface 102 of the single crystal semiconductor handle substrate 100. A flowable insulating layer tends to smooth and planarize during its deposition and reduce roughness. Based on the geometry of the material, the thickness of deposited film changes. Generally, surface tension dictates that the film will be thicker at concave geometries and thinner at convex areas. Flowable films may be deposited by solvent based spin on, or low temperature condensation reactions. Flowable films have the unique ability to planarize features and reduce roughness. In some embodiments, the flowable insulating layer comprises a flowable oxide. Flowable oxides include polymer precursors that have been dissolved or functionalized. By virtue of the solution or the activity of the polymer once deposited, it has the ability to move on the wafer surface. Two general application techniques are used, spin on dielectrics or CVD.

Figure 4A:
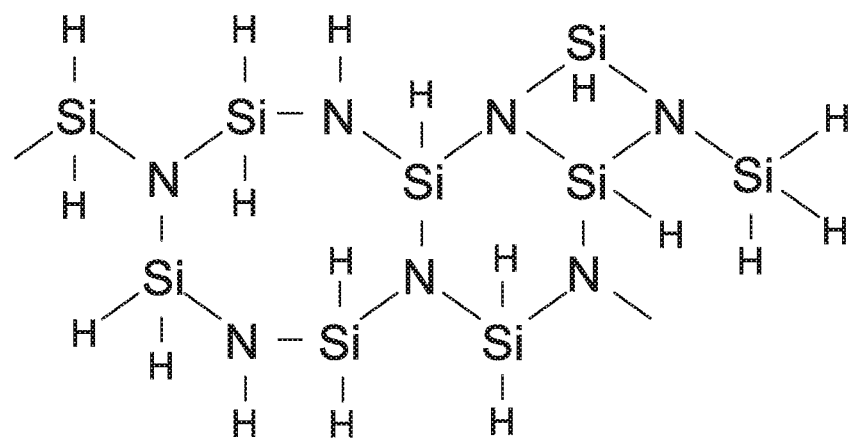
FIGS. 4A and 4B depicts structures of exemplary flowable silazanes.
Figure 4B:
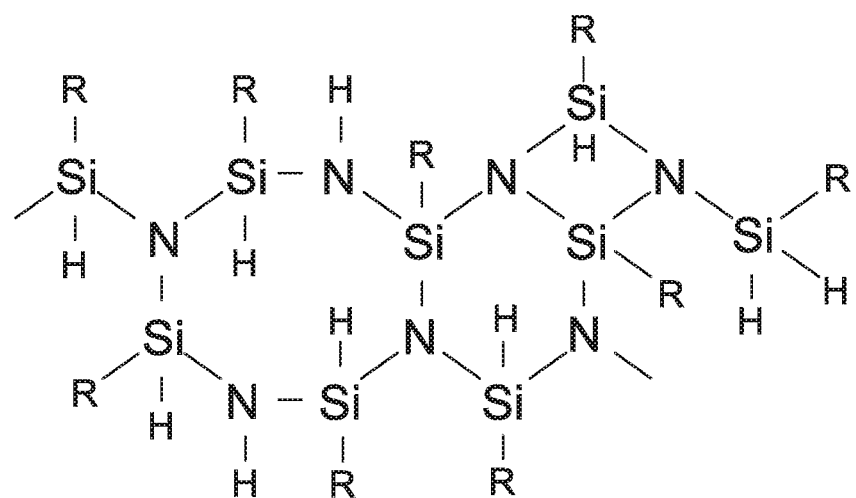

In some embodiments, the flowable insulating layer comprises a flowable silazane. Polysilazanes are polymers that comprise a polymer backbone comprising generally alternating silicon and nitrogen atoms. Flowable silazanes may be cured to remove $NH_3$ when pure undoped silica glass is required. Suitable dissolved polysilazane materials may be acquired from AZ Electronic Materials, Dow Chemical, and Sigma Aldrich. A suitable spin on tool may be acquired from Tokyo Electron Limited. Subsequent curing and annealing is common after deposition of the flowable silazane. Structures of exemplary flowable silazanes are depicted in FIGS. 4A and 4B. FIG. 4A depicts a non-derivatized flowable silazane. If all substituents R are H atoms, the polymer is designated as Perhydropolysilazane, Polyperhydridosilazane or Inorganic Polysilazane ($[H_2Si-NH]n$). FIG. 4B depicts a flowable silazane derivatized with R groups. In some embodiments, the R group comprises hydrocarbyl having from one to 12 carbon atoms, such as alkyl groups having from one to 12 carbon atoms, e.g., methyl, ethyl, n-propyl, isopropyl, butyl, etc. In some embodiments, the R group comprises aromatic groups having from three to 12 carbon atoms, e.g., phenyl, naphthyl, etc.

Figure 5:
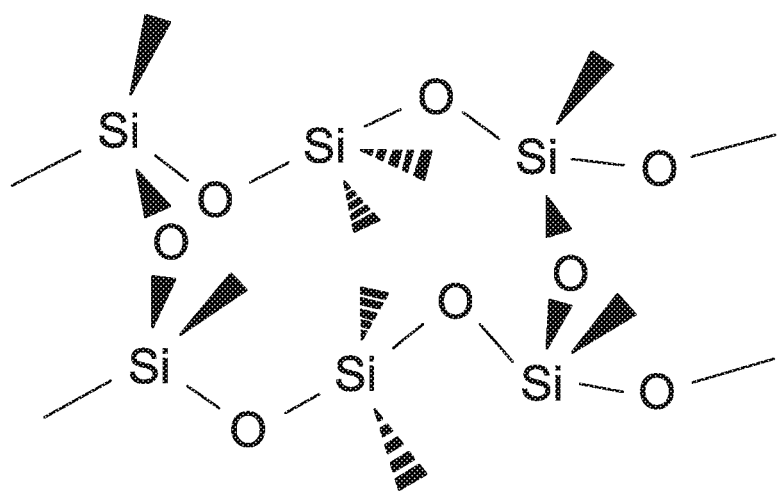
FIG. 5 depicts an exemplary structure of a flowable silsesquioxane.

In some embodiments, the flowable insulating layer comprises a flowable silsesquioxane. Silsesquioxanes are flowable silicon oxides. A silsesquioxane is an organosilicon compound with the chemical formula $[RSiO_3/2]n$ (R=H, alkyl, aryl or alkoxyl). In some embodiments, the R group comprises hydrocarbyl having from one to 12 carbon atoms, such as alkyl groups having from one to 12 carbon atoms, e.g., methyl, ethyl, n-propyl, isopropyl, butyl, etc. In some embodiments, the R group comprises alkoxy from one to 12 carbon atoms, e.g., methoxy, ethoxy, n-propoxy, isopropoxy, butoxy, etc. In some embodiments, the R group comprises aromatic groups having from three to 12 carbon atoms, e.g., phenyl, naphthyl, etc. Silsesquioxanes are colorless solids that adopt cage-like or polymeric structures with Si—O—Si linkages and tetrahedral Si vertices. Silsesquioxanes are known in molecular form with 6, 8, 10, and 12 Si vertices, as well as polymers. The cages are sometimes labeled T6 T8, T10, and T12, respectively (T=tetrahedral vertex). They are generally available as hydrogen silsesquioxane in a carrier solvent such as ketones or siloxane. Suitable silsesquioxane may be sourced from Dow Corning and Sigma Aldrich. A suitable spin on tool may be acquired from Tokyo Electron Limited. A structure of an exemplary flowable silsesquioxane is depicted in FIG. 5.

In some embodiments, a reflowable insulating layer comprises a doped oxide. In some embodiments, reflowable insulating layer comprises a silicate glass selected from the group consisting of phosphosilicate glass, borosilicate glass, borophosphosilicate glass (BPSG), and any combination thereof. Doped glasses are common in the industry to lower the glass transition temperature. By allowing the film to "reflow" at high temperatures, one may fill small voids or gaps.

In some embodiments, an insulating layer 120 comprising a flowable or reflowable material is deposited by contacting the front surface of the single crystal semiconductor handle substrate with a solution comprising oxide precursor and/or non-oxide precursor. For example, silsesquioxanes are commonly prepared from hydrolytic condensation reactions of trifunctional organosilicon monomers, e.g., $RSiCl_3$ or $RSi(OMe)_3$. Various alternatives are available with different structures or functional modification with organics. Silazanes are commonly available as monomers, and also offer the potential to be converted to oxide. There are also precursors commercially available for other nitrides, carbides, and borides. In some embodiments, the insulating layer 120 comprising a flowable or reflowable material has a thickness between about 50 nanometers and about 1 micrometer, between about 100 nanometers and about 1 micrometer.

IV. Curing the Flowable or Reflowable Insulating Layer

An insulating layer 120 comprising a flowable or reflowable material may be annealed to thereby reflow, cure, and/or densify the film. Both flowable and reflow films can be densified. Only reflowable films flow during an anneal. During densification of a reflowable insulating layer, such as doped oxides (like borophosphosilicate glass, BPSG), they reflow. Advantageously, reflow of a reflowable material can smooth the surface, thereby decreasing surface roughness and rendering the surface more amenable to bonding.

Flowable polymers only flow during deposition, and a subsequent cure locks it into place. Curing a flowable insulating layer may cause densification in the range of between about 5% and about 20%. Densification anneals may not change the thickness of measurement of density, but is usually used to chemically change the film, thereby making resistant to chemical etch. A flowable oxide insulating layer may be cured to remove residual solvent from the spin on process. Additionally, an as-deposited layer may be reactive after deposition, and a cure may redistribute NH, SiN, Si—O and Si—H bonds. The reaction mechanism responsible for the chemical changes is induced by heating in various ambient atmospheres, generally an oxidizing atmosphere. Curing of flowables is accompanied by weight loss, density, and change in dielectric properties. For certain applications, one might be interested in densification until it is very similar to thermal oxide.

In some embodiments, curing of the insulating layer 120 comprising a flowable or reflowable material may occur by contacting the layer with ozone. The ozone may be dissolved in water, or the insulating layer 12 may be exposed to an ozone containing ambient atmosphere. In some embodiments, curing of an insulating layer 120 comprising a flowable or reflowable material may occur by irradiating the layer with ultraviolet light, such as light having a wavelength between about 185 nanometers and about 256 nanometers, depending upon the composition of the insulating layer. In some embodiments, an insulating layer 120 comprising a flowable or reflowable material is cured by annealing the single crystal semiconductor handle substrate having the insulating layer on the front surface thereof, for example at a temperature between about 800° C. and about 1000° C., depending upon the composition of the insulating layer and the dopant concentration.

Cure and/or densification of the insulating layer 120 comprising a flowable or reflowable material may decrease the surface roughness. The surface roughness according to the root mean square method over a 2 micrometer by 2 micrometer surface area, $RMS_{2\times 2\ um2}$, is preferably less than about 2 angstroms, such as between about 1 angstrom and about 2 angstroms, wherein root mean squared is calculated according to the following equation:

$$R_q = \sqrt{\frac{1}{n}\sum_{i=1}^{n} y_i^2}$$

The roughness profile contains ordered, equally spaced points along the trace, and $y_i$ is the vertical distance from the mean line to the data point. At a surface roughness of preferably less than 2 angstroms, the surface is ready for bonding or optional oxidation.

V. Plasma Deposition of Insulating Layers

Figure 1C:
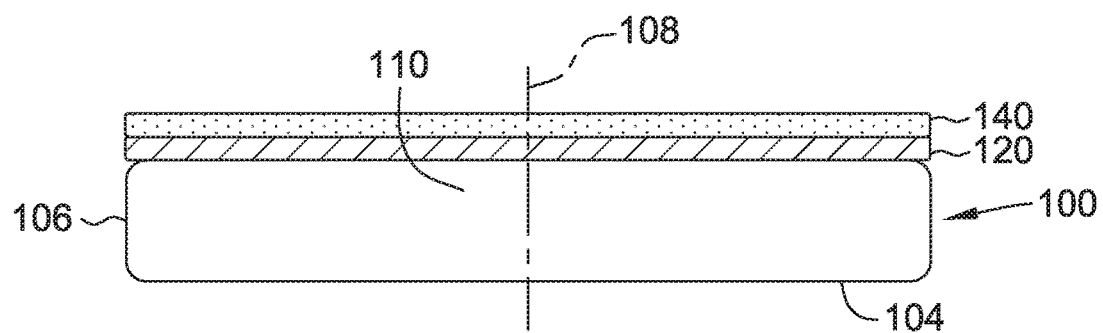

In some embodiments, one or more insulating layers may be prepared upon the front surface of the single crystal semiconductor handle substrate 100 or upon the front surface of a single crystal semiconductor donor substrate by a plasma deposition process, such as plasma enhanced chemical vapor deposition. In some embodiments, an insulating layer comprising a semiconductor oxide (e.g., silicon oxide) is deposited by an oxygen plasma treatment. In some embodiments, an insulating layer comprising a semiconductor nitride (e.g., silicon nitride) is deposited by a nitrogen plasma treatment. In some embodiments, an insulating layer comprising a semiconductor oxynitride (e.g., silicon oxynitride) is deposited by a plasma treatment comprising nitrogen and oxygen precursors. A wide variety of substrate configurations may be subjected to oxygen plasma treatment and/or nitrogen plasma treatment. With reference to FIG. 1A, the front surface 102 of the single crystal semiconductor handle substrate 100 may be subjected to oxygen plasma treatment and/or nitrogen plasma treatment to thereby deposit a semiconductor oxide (e.g., silicon oxide), a semiconductor nitride (e.g., silicon nitride), or a semiconductor oxynitride (e.g., silicon oxynitride). One or more insulating layers may be deposited by plasma deposition on the front surface 102 of the single crystal semiconductor handle substrate 100. With reference to FIGS. 1B and 1C, the surface of an insulating layer 120 comprising a flowable or reflowable material or an insulating layer 140 may be subjected to oxygen plasma treatment and/or nitrogen plasma treatment to deposit one or more additional insulating layers. In still further embodiments of the present invention, one or more insulating layers may be deposited upon the single crystal semiconductor donor substrate by plasma deposition.

In some embodiments, the oxygen plasma and/or nitrogen plasma surface activation tool is a commercially available tool, such as those available from EV Group, such as EVG®810LT Low Temp Plasma Activation System. General requirements of a plasma enhanced CVD chamber include a reactor with various electrode designs, power generation electronics, impedance matching network to transfer power to the gas load, mass flow controllers for input gasses, and pressure control systems. Typical systems are vertical tube reactors powered by an inductively coupled RF source. The single crystal semiconductor handle substrate 100 and/or donor substrate is loaded into the chamber and placed on a heated support chamber. The chamber is evacuated and backfilled with an oxygen gas source and/or a nitrogen gas source in a carrier gas, such as argon, to a pressure less than atmospheric to thereby create the plasma. Oxygen and/or water are suitable source gases for plasma oxide treatment. Ammonia and/or nitrogen and/or nitric oxide (NO) and/or nitrous oxide ($N_2O$) gas are suitable source gases for plasma nitride treatment. Oxynitride films may be deposited by including oxygen and nitrogen gas sources. Additionally, the use of nitric oxide or nitrous oxide additionally incorporates oxygen in to the insulating layer, thereby depositing an oxynitride film. To deposit a silicon nitride or a silicon oxide plasma film, suitable silicon precursors include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. Suitably, Ar is added as a carrier gas.

In some embodiments, a single crystal semiconductor handle substrate 100 or a single crystal silicon donor substrate is subjected to plasma treatment to deposit and insulating layer comprising semiconductor nitride (e.g., silicon nitride) or semiconductor oxynitride (e.g., silicon oxynitride). The substrates may be subjected to plasma deposition without any additional layers. Alternatively, one or more insulating layers may be deposited upon the substrates, and plasma enhanced CVD may be used to deposit additional insulating layers upon the insulating layers deposited according to other techniques.

Plasma deposition may be varied to tune the properties of the semiconductor nitride (e.g., silicon nitride) or semiconductor oxynitride (e.g., silicon oxynitride). For example, the pressure, flow rate, temperature, and relative ratio of precursors, e.g., ratio of $NH_3$ to $N_2O$ gases, may tune the silicon and nitride molar ratios of the plasma deposited nitride layer. Additionally, inclusion of an oxygen precursor incorporates oxygen to prepare an oxynitride layer. In some embodiments, plasma deposition may occur in an ambient atmosphere comprising silicon and nitrogen precursors to thereby deposit a silicon nitride layer on the handle substrate and/or donor substrate. After a duration sufficient to deposit nitride, an oxygen precursor may be introduced into the atmosphere to thereby deposit oxynitride. The oxygen concentration in the handle semiconductor oxynitride layer may vary according to a gradient, whereby the oxygen concentration is low at the interface with the handle semiconductor nitride layer and increases in the perpendicular direction away from the surface of the handle semiconductor oxynitride layer. After a duration sufficient to deposit an oxynitride layer, the flow of the nitrogen precursor may be ceased and deposition may continue only with silicon precursor and an oxygen gas source to thereby deposit an insulating layer comprising semiconductor oxide, e.g., silicon oxide. In some embodiments, a dielectric layer may be deposited by plasma techniques comprising a semiconductor nitride (e.g., silicon nitride) layer and a semiconductor oxynitride (e.g., silicon oxynitride) layer. In some embodiments, a dielectric layer may be deposited by plasma techniques comprising a semiconductor nitride (e.g., silicon nitride) layer, a semiconductor oxynitride (e.g., silicon oxynitride) layer, and a semiconductor oxide (e.g., silicon oxide) layer. Advantageously, plasma deposition of a dielectric layer comprising multiple insulating layers may occur continuously, i.e., without interruption, by varying the ratios and identities of the process gases.

The plasma deposited semiconductor nitride (e.g., silicon nitride), semiconductor oxynitride (e.g., silicon oxynitride), or semiconductor oxide (e.g., silicon oxide) may be formed at pressures between about 0.01 Torr and about 100 Torr, such as between about 0.1 Torr and about 1 Torr. Plasma deposition may occur at a temperature between about 20° C. and about 400° C. Insulating layers having a thickness between about 500 angstroms and about 10,000 angstroms can be deposited by PECVD at a rate between about 100 angstroms/minute and about 1000 angstroms/minute.

The flow rate ratios of the gaseous silicon precursor and the gaseous nitrogen precursor may be between about 1/200 and about 1/50, such as about 1/100. These ratios may yield a silicon nitride layer having a molar ratio of silicon to nitride of between about 0.7 and about 1.8. Oxygen may be incorporated in the plasma process, by adding an oxygen containing species such as oxygen or NO. Adding oxygen during plasma deposition enables the deposition of dielectric layers having compositions that vary in a gradient fashion, e.g., the layer may transition from semiconductor nitride (e.g., silicon nitride) to semiconductor oxynitride (e.g., silicon oxynitride) of increasing oxygen concentration to semiconductor oxide (e.g., silicon oxide).

The refractive index of the insulating layers may be tuned in the range between about 1.2 and about 3, such as between about 1.4 and about 2, or between about 1.5 and about 2. Post processing anneal and chemical vapor deposition of silicon oxide, $SiO_2$, is possible to further tune the bond interface or hydrogen content of the film. The bonding between the handle substrate and the donor substrate benefits from roughness of less than about 5 angstroms, according to the root mean square method over a 2 micrometer by 2 micrometer surface area, $RMS_{2\times 2\ um2}$. Generally this can be achieved in a plasma deposition with controlled inductively coupled plasma and lowering the bias power below the roughening threshold. Successful layer transfer has been demonstrated on plasma deposited films with roughness of about 5 angstroms or less.

Silicon oxynitride comprises a material having a composition that has a chemical formula $Si_xO_yN_z$. In its amorphous form, the values of x, y, and z may vary continuously between $SiO_2$ (silicon dioxide) and $Si_3N_4$ (silicon nitride). Accordingly, in a silicon oxynitride layer, the values of y and z are both greater than 0. A known crystalline form of silicon oxynitride is $Si_2ON_2$. According to some embodiments, the silicon oxynitride may be deposited in a gradient fashion, such that the composition of the film and thus the refractive index of the film may vary in a gradient fashion. In some embodiments, silicon oxynitride may be deposited upon a silicon nitride film by the gradual introduction of an oxygen precursor (e.g., oxygen, water, $N_2O$) into the plasma deposition ambient atmosphere, which may comprise a silicon precursor and a nitrogen precursor, e.g., ammonia. The ratio of $NH_3:N_2O$ may be varied, that is, lowered, during deposition to gradually increase the oxygen content in the silicon oxynitride layer. In some embodiments, after deposition of a gradient silicon oxynitride layer, all nitrogen precursors are eliminated from the plasma deposition atmosphere, and the atmosphere contains silicon precursors and oxygen precursors, which enables deposition of a silicon dioxide layer on the silicon oxynitride layer. According to some embodiments, the refractive index range of the silicon oxynitride film may vary between 2.0 for silicon nitride and 1.45 for silicon dioxide.

Silicon nitride produced from plasma is structurally distinct from silicon nitride deposited according to conventional chemical or physical vapor deposition techniques. Conventional CVD or PVD deposition generally results in a silicon nitride layer having a stoichiometry of $Si_3N_4$. Plasma processes can be controlled to deposit a film having a composition such as $Si_xN_yH_z$ depending on the ratios of input reactant gasses, power level, substrate temperature, and overall reactor pressure. Pathways in a plasma system exist to form Si—N, Si=N and Si≡N bonds. This is due to the fact that plasma energies are a hammer that produce $Si_xH_z$ and $N_yH_z$ species. For example, the refractive index and optical gap change dramatically with the Si/N ratio. At higher silane concentrations, the films become Si rich and may reach an index of refraction up to 3.0 (compared to 2 for LPCVD). Other properties that may be influenced include dielectric constant, breakdown, mechanical, and chemical (etch rate).

VI. Preparation of the Bonded Structure

With reference to FIG. 2, the single crystal semiconductor handle substrate 100, e.g. a single crystal semiconductor handle wafer such as a single crystal silicon handle wafer, prepared according to the method described herein is next bonded to a semiconductor donor substrate 500, e.g., a single crystal semiconductor donor wafer, which is prepared according to conventional layer transfer methods. The single crystal semiconductor donor substrate 500 may be a single crystal semiconductor wafer. In preferred embodiments, the semiconductor wafer comprises a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer 500 may comprise electrically active dopants, such as boron (p type), gallium (p type), aluminum (p type), indium (p type), phosphorus (n type), antimony (n type), and arsenic (n type). The resistivity of the single crystal semiconductor (e.g., silicon) donor wafer may range from 1 to 50 Ohm-cm, typically, from 5 to 25 Ohm-cm. The single crystal semiconductor donor wafer 500 may be subjected to standard process steps including oxidation, implant, and post implant cleaning. Accordingly, a semiconductor donor substrate 500, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the single crystal semiconductor donor substrate 500 comprises a dielectric layer. The dielectric layer may comprise one or more insulating layers formed on the front surface of the single crystal semiconductor donor substrate 500. In some embodiments, the dielectric layer 420 comprises multiple layers of insulating material, for example, as depicted in FIG. 2, although other configurations are within the scope of this invention. Each insulating layer may comprise a material selected from among silicon dioxide, silicon nitride, hafnium oxide, titanium oxide, zirconium oxide, lanthanum oxide, barium oxide, and a combination thereof. In some embodiments, each insulating layer may comprise a material selected from the group consisting of silicon dioxide, silicon nitride, and siliconoxynitride. Each insulating layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers. As depicted in FIG. 2, the dielectric layer 420 comprises three layers. One, two, or three of the layers may be formed upon the single crystal semiconductor handle substrate 100. One, two, or three of the layers may be formed upon the single crystal semiconductor donor substrate 500. Still further, one or two of the layers may be formed upon the single crystal semiconductor handle substrate 100, and one or two of the layers may be formed upon the single crystal semiconductor donor substrate 500.

In some embodiments, the front surface of the single crystal semiconductor donor substrate 500 (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surface of the single crystal semiconductor donor substrate 500 may be thermally oxidized in a furnace such as an ASM A400 in the same manner described above. In some embodiments, the single crystal semiconductor donor substrate 500 is oxidized to provide an oxide layer on the front surface layer of at least about 1 nanometer thick, about 10 nanometer thick, such as between about 10 nanometers and about 10,000 nanometers, between about 10 nanometers and about 5,000 nanometers, or between about 100 nanometers and about 400 nanometers. In some embodiments, the oxidation layer on the single crystal semiconductor donor substrate 500 is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

Ion implantation may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer in the final SOI structure. The ions may be implanted to a depth between about 100 angstroms and about 30,000 angstroms, such as between about 200 angstroms and about 20,000 angstroms, such as between about 2000 angstroms and about 15,000 angstroms, or between about 15,000 angstroms and about 30,000 angstroms. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate 500 having an ion implant region therein formed by He$^+$, H$^+$, $H_2^+$, and any combination thereof ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface of the single crystal semiconductor donor substrate 500 and the front surface of single crystal semiconductor handle substrate 100 are next brought into intimate contact to thereby form a bonded structure. According to the methods of the present invention, each of the front surface of the single crystal semiconductor donor substrate 500 and the front surface of single crystal semiconductor handle substrate 100 may comprise one or more insulating layers. The insulating layers form the dielectric layer of the bonded structure. With reference to FIG. 2, an exemplary dielectric layer 420 is shown. As depicted therein, the dielectric layer 420 of the bonded structure may comprise a first oxide layer 200, a nitride layer 300, a second oxide layer 400. Further configurations are within the scope of this disclosure.

Since the mechanical bond may be relatively weak, the bonded structure may be further annealed to solidify the bond between the single crystal semiconductor donor substrate 400 and the single crystal semiconductor handle substrate 100 comprising the epitaxial layer 200 and the polycrystalline silicon charge trapping layer 300. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some embodiments, the bonded structure is annealed at a temperature of from about 200° C. to about 400° C., from about 300° C. to about 400° C., such as from about 350° C. to about 400° C.

In some embodiments, the anneal may occur at relatively high pressures, such as between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa. In conventional bonding methods, the temperature is likely limited by the "autocleave". This occurs when the pressure of the platelets at the implant plane exceeds the external isostatic pressure. Accordingly, conventional anneal may be limited to bonding temperatures between about 350° C. and about 400° C. because of autocleave. After implantation and bond, the wafers are weakly held together. But the gap between the wafers is sufficient to prevent gas penetration or escape. Weak bonds can be strengthened by heat treatments, but the cavities formed during implant are filled with gas. While heating, the gas inside the cavities pressurizes. It is estimated that the pressure may reach 0.2-1 GPa (Cherkashin et al., J. Appl. Phys. 118, 245301 (2015)), depending on the dosage. When the pressure exceeds a critical value, the layer delaminates. This is referred to as an autocleave or thermal cleave. It prevents higher temperature or longer time in the anneal. According to some embodiments of the present invention, bonding occurs at elevated pressures, e.g., between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa, which thereby enables bonding at elevated temperatures. In some embodiments, the bonded structure is annealed at a temperature of from about 300° C. to about 700° C., from about 400° C. to about 600° C., such as between about 400° C. and about 450° C., or even between about 450° C. and about 600° C., or between about 350° C. and about 450° C. Increasing the thermal budget will have a positive effect on the bond strength. Thermal annealing may occur for a duration of from about 0.5 hours to about 10 hour, such as between about 0.5 hours and about 3 hours, preferably a duration of about 2 hours. Thermal annealing within these temperatures ranges is sufficient to form a thermally activated cleave plane. In conventional bonding anneals, the edge of both the handle wafer and donor wafer may become far apart due to the roll off. In this area, there is no layer transfer. It is called the terrace. Pressurized bonding is expected to reduce this terrace, extending the SOI layer further out towards the edge. The mechanism is based on trapped pockets of air being compressed and "zippering" outwards. After the thermal anneal to activate the cleave plane, the bonded structure may be cleaved.

After the thermal anneal, the bond between the single crystal single crystal semiconductor donor substrate 500 and the single crystal semiconductor handle substrate 100 is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer 600, preferably a silicon device layer, on the semiconductor-on-insulator composite structure. See FIG. 3.

After cleaving, the cleaved structure may be subjected to a high temperature anneal in order to further strengthen the bond between the transferred device layer 600 and the single crystal semiconductor handle substrate 100. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer may be brought to the desired thickness and smoothness by subjecting to a vapor phase HCl etch process in a horizontal flow single wafer epitaxial reactor using $H_2$ as a carrier gas. In some embodiments, the semiconductor device layer 600 may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

In some embodiments, an epitaxial layer may be deposited on the transferred single crystal semiconductor device layer 600. A deposited epitaxial layer may comprise substantially the same electrical characteristics as the underlying single crystal semiconductor device layer 600. Alternatively, the epitaxial layer may comprise different electrical characteristics as the underlying single crystal semiconductor device layer 600. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise electrically active dopants, such as boron (p type), gallium (p type), aluminum (p type), indium (p type), phosphorus (n type), antimony (n type), and arsenic (n type). The resistivity of the epitaxial layer may range from 1 to 50 Ohm-cm, typically, from 5 to 25 Ohm-cm. In some embodiments, the epitaxial layer may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

The finished SOI wafer comprises the single crystal semiconductor handle substrate 100, the dielectric layer 420, and the semiconductor device layer 600, may then be subjected to end of line metrology inspections and cleaned a final time using typical SC1-SC2 process.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of preparing a multilayer structure, the method comprising:
    bonding a donor dielectric layer on a front surface of a single crystal silicon donor substrate to a front surface of a single crystal silicon handle substrate to thereby form a bond between the donor dielectric layer on the front surface of the single crystal silicon donor substrate and the front surface of the single crystal silicon handle substrate, which thereby forms a bonded structure, wherein (i) the single crystal silicon handle substrate comprises two major, generally parallel surfaces, one of which is the front surface of the single crystal silicon handle substrate and the other of which is a back surface of the single crystal silicon handle substrate, a circumferential edge joining the front surface and the back surface of the single crystal silicon handle substrate, a central plane between the front surface and the back surface of the single crystal silicon handle substrate, and a bulk region between the front and back surfaces of the single crystal silicon handle substrate and (ii) the single crystal silicon donor substrate comprises two major, generally parallel surfaces, one of which is the front surface of the single crystal silicon donor substrate and the other of which is a back surface of the single crystal silicon donor substrate, a circumferential edge joining the front and back surfaces of the single crystal silicon donor substrate, a central plane between the front and back surfaces of the single crystal silicon donor substrate, and a bulk region between the front and back surfaces of the single crystal silicon donor substrate, and further wherein the single crystal silicon donor substrate comprises a cleave plane;
    annealing the bonded structure at a temperature and for a duration sufficient to thermally activate the cleave plane and to strengthen the bond between the donor dielectric layer on the front surface of the single crystal silicon donor substrate and the front surface of the single crystal silicon handle substrate, wherein annealing occurs at a temperature between about 400° C. to about 600° C., and at a pressure between 0.5 MPa and about 10 MPa and for a duration between 0.5 hours and about 10 hours, wherein annealing the bonded structure thermally activates the cleave plane without thermally cleaving the bonded structure; and
    after annealing the bonded structure, cleaving the bonded structure at the cleave plane of the single crystal silicon donor substrate to thereby prepare a cleaved structure comprising the single crystal silicon handle substrate, the donor dielectric layer, and a single crystal silicon device layer.

2. The method of claim 1 wherein the single crystal silicon handle substrate comprises a single crystal silicon wafer sliced from a single crystal silicon ingot grown by the Czochralski method or the float zone method.

3. The method of claim 1 wherein the single crystal silicon donor substrate comprises a single crystal silicon wafer sliced from a single crystal silicon ingot grown by the Czochralski method or the float zone method.

4. The method of claim 1 wherein annealing occurs at a temperature between about 400° C. and about 450° C., or between about 450° C. and about 600° C.

5. The method of claim 1 wherein annealing occurs at a pressure between 0.5 MPa and about 5 MPa.

6. The method of claim 1 wherein the donor dielectric layer comprises a material selected from the group consisting of silicon dioxide, silicon oxynitride, silicon nitride, hafnium oxide, titanium oxide, zirconium oxide, lanthanum oxide, barium oxide, and any combination thereof.

7. The method of claim 1 wherein the donor dielectric layer comprises a material selected from the group consisting of silicon dioxide, silicon oxynitride, silicon nitride, and any combination thereof.

8. The method of claim 1 wherein the donor dielectric layer comprises a multilayer, each insulating layer within the multilayer comprising a material selected from the group consisting of silicon dioxide, silicon oxynitride, and silicon nitride.

9. The method of claim 1 wherein the donor dielectric layer comprises three layers, wherein the three layers comprise a silicon dioxide layer in interfacial contact with the front surface of the single crystal silicon donor substrate, a silicon nitride layer in interfacial contact with the silicon dioxide layer, and a silicon dioxide layer in interfacial contact with the silicon nitride layer.

10. The method of claim 1 wherein the donor dielectric layer comprises an insulating layer having a thickness of at least about 10 nanometer thick, between about 10 nanometers and about 10,000 nanometers, between about 10 nanometers and about 5,000 nanometers, between 50 nanometers and about 400 nanometers, or between about 100 nanometers and about 400 nanometers, about 50 nanometers, 100 nanometers, or 200 nanometers.

11. A method of preparing a multilayer structure, the method comprising:
bonding a donor dielectric layer on a front surface of a single crystal silicon donor substrate to a handle dielectric layer on a front surface of a single crystal silicon handle substrate to thereby form a bond between the donor dielectric layer on the front surface of the single crystal silicon donor substrate and the handle dielectric layer on the front surface of the single crystal silicon handle substrate, which thereby forms a bonded structure, wherein (i) the single crystal silicon handle substrate comprises two major, generally parallel surfaces, one of which is the front surface of the single crystal silicon handle substrate and the other of which is a back surface of the single crystal silicon handle substrate, a circumferential edge joining the front surface and the back surface of the single crystal silicon handle substrate, a central plane between the front surface and the back surface of the single crystal silicon handle substrate, and a bulk region between the front and back surfaces of the single crystal silicon handle substrate and (ii) the single crystal silicon donor substrate comprises two major, generally parallel surfaces, one of which is the front surface of the single crystal silicon donor substrate and the other of which is a back surface of the single crystal silicon donor substrate, a circumferential edge joining the front and back surfaces of the single crystal silicon donor substrate, a central plane between the front and back surfaces of the single crystal silicon donor substrate, and a bulk region between the front and back surfaces of the single crystal silicon donor substrate, and further wherein the single crystal silicon donor substrate comprises a cleave plane;
annealing the bonded structure at a temperature and for a duration sufficient to thermally activate the cleave plane and to strengthen the bond between the donor dielectric layer of the single crystal silicon donor substrate and the handle dielectric layer on the front surface of the single crystal silicon handle substrate, wherein annealing occurs at a temperature between about 400° C. to about 600° C., and at a pressure between 0.5 MPa and about 10 MPa and for a duration between 0.5 hours and about 10 hours, wherein annealing the bonded structure thermally activates the cleave plane without thermally cleaving the bonded structure; and
after annealing the bonded structure, cleaving the bonded structure at the cleave plane of the single crystal silicon donor substrate to thereby prepare a cleaved structure comprising the single crystal silicon handle substrate, the handle dielectric layer, the donor dielectric layer, and a single crystal silicon device layer.

12. The method of claim 11 wherein the single crystal silicon handle substrate comprises a single crystal silicon wafer sliced from a single crystal silicon ingot grown by the Czochralski method or the float zone method.

13. The method of claim 11 wherein the single crystal silicon donor substrate comprises a single crystal silicon wafer sliced from a single crystal silicon ingot grown by the Czochralski method or the float zone method.

14. The method of claim 11 wherein the handle dielectric layer comprises a doped oxide.

15. The method of claim 11 wherein the handle dielectric layer comprises a silicate glass selected from the group consisting of phosphosilicate glass, borosilicate glass, borophosphosilicate glass, and any combination thereof.

16. The method of claim 11 wherein the handle dielectric layer comprises a flowable oxide.

17. The method of claim 11 wherein the handle dielectric layer comprises a flowable silazane.

18. The method of claim 11 wherein handle dielectric layer comprises a flowable silsesquioxane.

19. The method of claim 11 wherein annealing occurs at a temperature between about 400° C. and about 450° C., or between about 450° C. and about 600° C.

20. The method of claim 11 wherein annealing occurs at a pressure between 0.5 MPa and about 5 MPa.

21. The method of claim 11 wherein the donor dielectric layer comprises a material selected from the group consisting of silicon dioxide, silicon oxynitride, silicon nitride, hafnium oxide, titanium oxide, zirconium oxide, lanthanum oxide, barium oxide, and any combination thereof.

22. The method of claim 11 wherein the donor dielectric layer comprises a material selected from the group consisting of silicon dioxide, silicon oxynitride, silicon nitride, and any combination thereof.

23. The method of claim 11 wherein the donor dielectric layer comprises a multilayer, each insulating layer within the multilayer comprising a material selected from the group consisting of silicon dioxide, silicon oxynitride, and silicon nitride.

24. The method of claim 11 wherein the donor dielectric layer comprises three layers, wherein the three layers comprise a silicon dioxide layer in interfacial contact with the front surface of the single crystal silicon donor substrate, a silicon nitride layer in interfacial contact with the silicon dioxide layer, and a silicon dioxide layer in interfacial contact with the silicon nitride layer.

25. The method of claim 11 wherein the donor dielectric layer comprises an insulating layer having a thickness of at least about 10 nanometer thick, between about 10 nanometers and about 10,000 nanometers, between about 10 nanometers and about 5,000 nanometers, between 50 nanometers and about 400 nanometers, or between about 100 nanometers and about 400 nanometers, about 50 nanometers, 100 nanometers, or 200 nanometers.

26. The method of claim 1 further comprising annealing the cleaved structure at a temperature of from about 1000° C. to about 1200° C.

27. The method of claim 11 further comprising annealing the cleaved structure at a temperature of from about 1000° C. to about 1200° C.

* * * * *